United States Patent [19]

Peterson et al.

[11] Patent Number: 5,113,467
[45] Date of Patent: May 12, 1992

[54] LASER TRANSMITTER INTERLOCK

[75] Inventors: Gerald W. Peterson, Poughkeepsie; Bert W. Weidle, Ulster Park, both of N.Y.

[73] Assignee: International Business Machines Corporation, Armonk, N.Y.

[21] Appl. No.: 612,300

[22] Filed: Nov. 13, 1990

[51] Int. Cl.⁵ .............................................. G02B 6/42
[52] U.S. Cl. .................................... 385/88; 385/57
[58] Field of Search ............. 350/96.20, 96.15, 96.21, 350/96.29; 324/207.2, 207.14, 157

[56] References Cited

U.S. PATENT DOCUMENTS

| | | | |
|---|---|---|---|
| 4,124,814 | 11/1978 | Lauerman | 324/207.2 |
| 4,223,228 | 9/1980 | Kaplan | 250/491 |
| 4,491,792 | 1/1985 | Bullock et al. | 324/157 |
| 4,549,783 | 10/1985 | Schmachtenberg, III | 350/96.20 |
| 4,830,449 | 5/1989 | Spillman, Jr. | 350/96.15 |

FOREIGN PATENT DOCUMENTS 2197483  5/1988  United Kingdom .

*Primary Examiner*—Frank Gonzalez
*Attorney, Agent, or Firm*—William A. Kinnaman, Jr.

[57] ABSTRACT

A Hall effect sensor associated with the receptacle of a laser transmitter module senses the presence of a magnet carried by a fiber-optic connector when the connector is inserted in the receptacle. The output signal from the sensor is used to disable the laser transmitter if the fiber-optic connector is not inserted, providing a safety interlock as well as a positive key against the insertion of incompatible multimode connectors.

5 Claims, 3 Drawing Sheets

LASER TRANSMITTER INTERLOCK

BACKGROUND OF THE INVENTION

1. Field of the Invention

The present invention relates generally to light transmitters and more particularly to an improved interlock for a laser transmitter adapted to be coupled to a fiber-optic transmission line.

2. Description of the Related Art

A transmitter for coupling a modulated light signal to a fiber-optic transmission line, particularly one using a laser light source, produces a narrow cone of light at the exit of the transmitter. Legal requirements relating to external radiation when a fiber-optic coupler is disconnected, such as the CDRH and IEC-825 laser safety requirements, have been an obstacle to using lasers with serial fiber-optic data channels. The following proposals have been made in the prior art to prevent external radiation when a fiber-optic coupler is disconnected.

IBM Technical Disclosure Bulletin, Vol. 22, No. 6, pp. 2393-94 (November, 1979), entitled "Safety Closure for Fiber-Optic Devices", discloses a mechanical closure which prevents external radiation when the coupler is disconnected.

U.S. Pat. Nos. 4,242,657 and 2,573,920 disclose connectors that employ magnets to achieve an interlocking action. Both patents are related to electrical connectors where the absence or presence of the plug will trigger the magnets to either cut off or supply energy to the receptacle. These patents use magnets to physically close the circuit but do not produce a signal external to the connector to indicate proper engagement.

U.S. Pat. No. 3,960,428 discloses an electrical connector in which a signal is generated when the connector is fully engaged. The physical means for actually detecting the presence of the connector is mechanical.

U.S. Pat. No. 4,849,743 discloses a device for electrically detecting that the wires in a connector have been placed in the correct cavity and that they are properly seated.

U.S. Pat. Nos. 4,665,362 and 4,107,604 disclose Hall effect sensors for detecting the relative positions of two members in an assembly. These patents do not disclose either a connector arrangement or an interlocking device.

U.S. Pat. Nos. 4,844,582, 4,690,495 and 4,004,298 show connectors which use magnets in both the plug and receptacle in order to aid in alignment and coupling. U.S. Pat. Nos. 4,844,582 and 4,690,495 disclose fiber-optic connectors.

These prior art proposals have not proved altogether satisfactory, particularly in terms of applicability to transmitters and connectors presently specified for use in commercial applications.

SUMMARY OF THE INVENTION

It is therefore an object of the present invention to provide an improved interlock for laser transmitters and fiber-optic connectors; a low cost system which can be readily incorporated into, and which is compatible with, existing design specifications. A further object of the invention is the provision of an interlock which produces an external signal; a signal which in addition to a interlock can be used to provide an indication of insertion for error detection and fault isolation.

Briefly, this invention contemplates the provision of a Hall effect sensor associated with the receptacle of a laser transmitter or transmitter/receiver module which senses the presence of a magnet carried by a fiber-optic connector when the connector is inserted in the receptacle. The output signal from the sensor is used to disable the laser transmitter if the fiber-optic connector is not inserted, providing a interlock as well as a positive key against the insertion of incompatible multimode connectors. The sensor output also can be used to provide an insertion indication for error detection and fault isolation.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF THE PREFERRED EMBODIMENT

Figure 1:
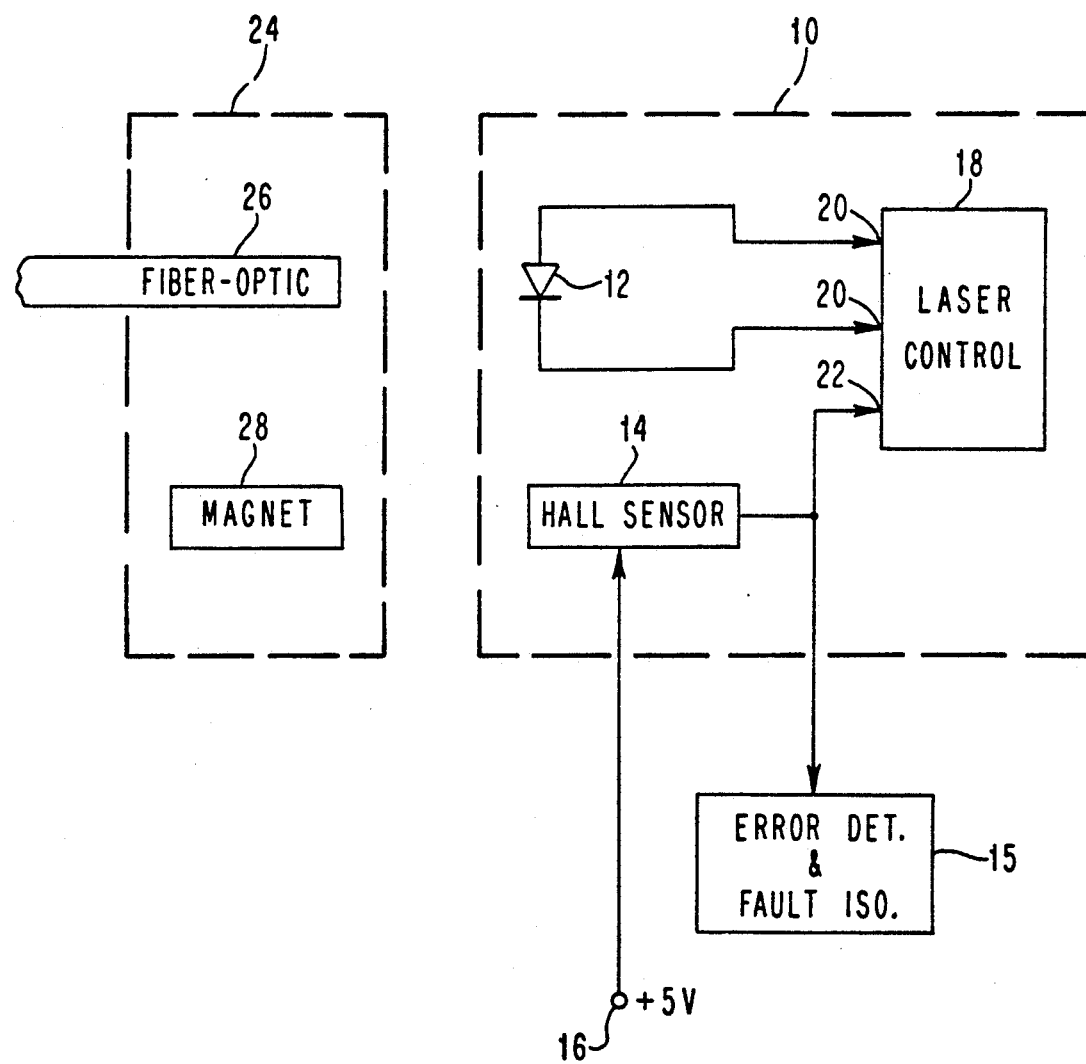
FIG. 1 is a schematic block diagram of the interlock system in accordance with the teachings of this invention.

Referring now to FIG. 1, a laser transmitter/receiver module 10 houses a laser diode transmitter 12 and a Hall effect sensor 14. A typical transmitter/receiver module would also include a photodetector receiver (not shown). Leads couple a suitable power source 16, external to the module 10, to the Hall sensor 14. A commercially available Hall sensor may be used, the output of which switches between a first voltage level in the absence of a magnetic field and a second level in response to the presence of a magnetic field. The laser diode 12 is coupled to a bias controller 18 which controls the energization of diode 12. Controller 18 may conveniently be a commercially available integrated circuit laser diode bias controller and includes, among other terminals, terminals 20 connected to the diode 12 and an enable/disable terminal 22 coupled to the output of the Hall sensor 14.

A cooperating connector 24 carries a fiber-optic line 26 to which light from diode 12 is coupled and a magnet 28. As will be appreciated by those skilled in the art, connector 24 typically carries another fiber-optic line (not shown) for transmitting light signals to a photodetector in the module 10.

In operation, in the absence of a sufficiently strong magnetic field, the Hall sensor 14 has a first output voltage level which provides a disable input to the controller 18, thus preventing energization of diode 12. When the connector 24 is moved into position with respect to the transmitter 10 such that the end of the fiber-optic line 26 is properly positioned with respect to diode 12, magnet 28 is then sufficiently close to Hall sensor 14 to cause the sensor to switch to its second output level, providing an enable input to controller 18. In addition, the binary output of sensor 14 may be coupled to error detection and fault isolation circuitry 15 located outside the module 10. Here, a disable output from the Hall sensor indicates the particular module and connector are not properly coupled.

Figure 2:
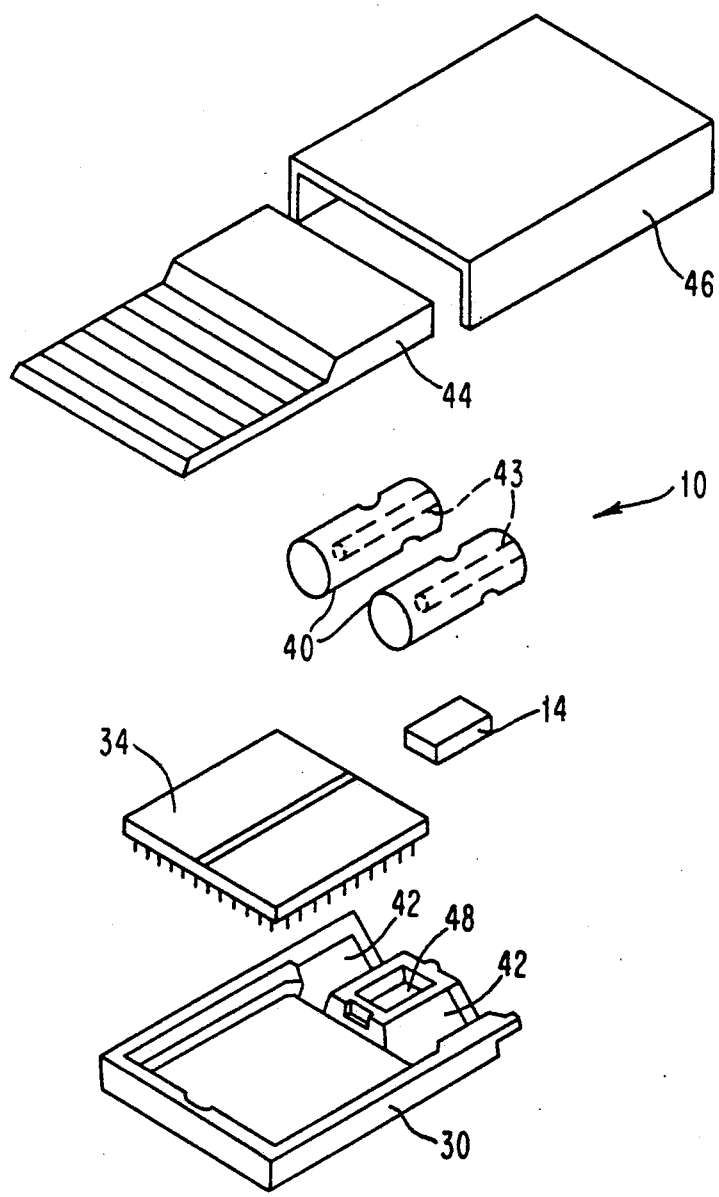
FIG. 2 is an exploded, perspective view of an laser transmitter/receiver which employs an embodiment of an interlock system in accordance with the teachings of this invention.

Referring now to FIG. 2, there is shown a specific embodiment of a fiber-optic transmitter/receiver module 10 in accordance with the teachings of this invention. It includes a base 30 and a printed circuit substrate 34 to which the bias control 18 may be attached.

A pair of cylindrically shaped optical subassemblies 40 fit into depressions 42 in the base 30. The subassemblies 40 each have a recess 43 into which fits the end of a fiber-optic line carried by a ferrule on the connector 24. As will be appreciated by those skilled in the art, one of the optical subassemblies 40 serves as a transmitter and includes the laser diode 12, and the other serves as a receiver and includes a photodetector. Leads, not shown, connect the optical subassemblies 40 to the substrate 34.

In accordance with the teachings of this invention, a Hall effect transducer 14 is positioned in a depression 48 located between the recesses 42 into which the optical subassemblies 40 fit. Leads, not shown, connect the Hall effect sensor 14 to the substrate 34 which in turn connects the Hall sensor to the controller 18. A heat sink 44 covers the module 10 and a shroud 46 completes the connector assembly.

Figure 3:
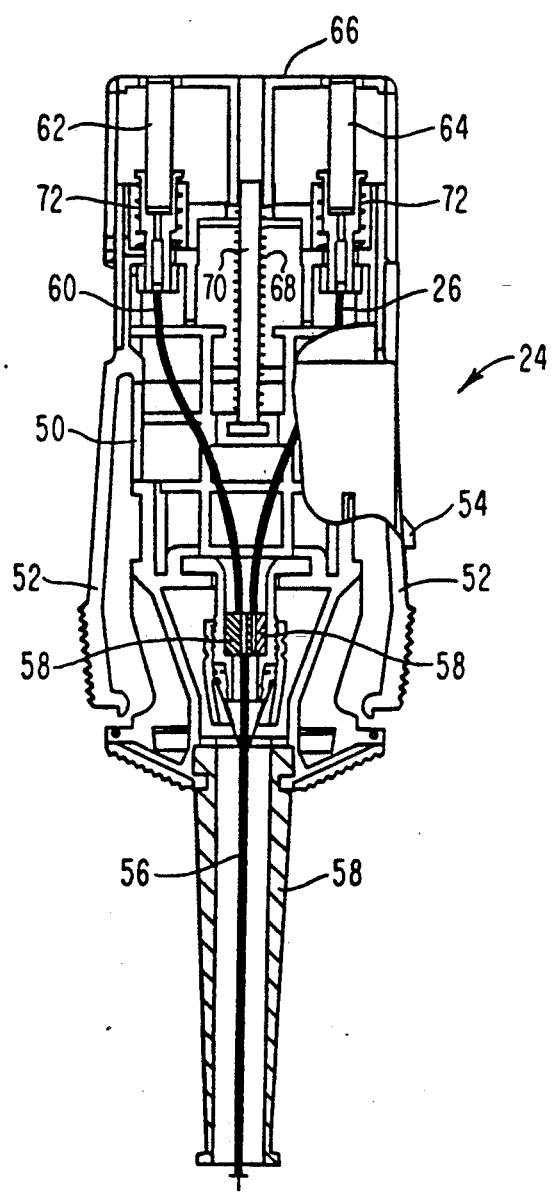
FIG. 3 is a plan view, with parts broken away and parts shown in cross-section, of a connector for use with the transmitter/receiver module of FIG. 1.

Referring now to FIG. 3, the connector 24 comprises a main plastic body member 50 with integral flexible arms 52 for securing the connector to the transmitter module 10 by means of hooks 54 which engage receptacles on the shroud 46 when the connector is in place.

A fiber-optic cable 56 enters the housing 50 through a tube 58. The cable 56 includes fiber-optic line 26 for transmitting light from diode 12 and a line 60 for transmitting light to the module 10. Portions of the lines 26 and 60 are respectively secured in ferrules 62 and 64 with the ends of fiber-optic lines substantially flush with the ends of the ferrules. The ferrules 62 and 64 extend to openings in a cap 66, which is movable with respect to the housing 50. A compression spring 68 on a permanent magnet post 70 urges the cap 66 to the position shown where the top of the cap is approximately flush with the outer ends of the ferrules 62 and 64. Compression springs 72 resiliently mount the ferrules 62 and 64 to the housing 50. In accordance with the teaching of this invention, the permanent magnet 70 (in this specific embodiment a "T"-shaped post) is located in the connector 24 between the fiber-optic lines 26 and 60 so that one end of the magnet is close to the Hall sensor 14 when the connector and module 10 are secured together. In this latter position the field of the magnet 70 is sufficient to switch the Hall sensor 14. It will be appreciated that other switchable connector configurations may be employed so long as the connector generates a sufficient magnetic field to switch the Hall sensor when the connector and module are properly attracted to one another.

In operation, as the connector 24 is inserted into the module 10, the front of the module 10 pushes back the cap 66 on the connector, exposing the ferrules 62 and 64 which then slide into cavities in the optical subassemblies 40. The end of the post 70 moves toward the Hall effect sensor 14 in the transmitter module 10. When the ferrules 62 and 64 seat the ends of the fiber-optic lines 60 and 26 in the optical subassemblies 40, the end of magnet post 70 is closely adjacent the Hall sensor 14. The field generated by the magnet 70 is sufficiently strong in the region of the Hall sensor 14 to switch it from its first to its second output level. The output of the sensor is connected to the controller 18 inside the module 10, and provides an enable signal to the controller. This same binary signal may be also coupled to the fault detector 15 to indicate that a proper connection has been made.

While the invention has been described in terms of a single preferred embodiment, those skilled in the art will recognize that the invention can be practiced with modification within the spirit and scope of the appended claims.

What is claimed is:

1. An interlock system for a laser transmitter module adapted to be coupled to a fiber-optic connector having means associated therewith for generating a magnetic field, said interlock system comprising:
   a laser light source mounted on said module;
   a Hall effect sensor mounted on said module, said sensor producing a first signal in the absence of said magnetic field and a second signal in the presence of said magnetic field; and
   means for disabling energization of said laser source in response to said first signal and for enabling energization of said laser in response to said second signal.

2. An interlock system for a laser transmitter module adapted to be coupled to a fiber-optic connector comprising:
   a pair of optical subassemblies mounted on said module, one of said optical subassemblies including a laser light source;
   a pair of fiber-optic lines mounted on said connector and a magnet mounted on said connector between said lines;
   a Hall effect sensor mounted on said module between said pair of optical subassemblies, said sensor producing a first signal in the absence of a magnetic field generated by said connector and a second signal in the presence of a magnetic field generated by said connector; and
   means for disabling energization of said laser light source in response to said first signal and for enabling energization of said laser light source in response to said second signal.

3. An interlock system as in claim 1, further including said connector, said connector having a magnet mounted thereon for generating said magnetic field.

4. An interlock system as in claim 1, further including an error detection circuit and means for coupling said first and second signals to said error detection circuit.

5. An interlock system as in claim 4 in which said error detection circuit is external to said module.

* * * * *